United States Patent
De Lima Filho et al.

(10) Patent No.: US 7,994,766 B2
(45) Date of Patent: Aug. 9, 2011

(54) DIFFERENTIAL CURRENT SENSOR DEVICE AND METHOD

(75) Inventors: Jader Alves De Lima Filho, Campinas (BR); Wallace A. Pimenta, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 381 days.

(21) Appl. No.: 12/130,164

(22) Filed: May 30, 2008

(65) Prior Publication Data

US 2009/0295353 A1 Dec. 3, 2009

(51) Int. Cl.
*G05F 1/573* (2006.01)
*G05F 1/575* (2006.01)

(52) U.S. Cl. .................. 323/282; 323/277; 323/286

(58) Field of Classification Search .............. 323/277, 323/284, 315, 316, 317, 282, 285, 286; 327/51, 327/52, 53, 65, 66; 361/87
See application file for complete search history.

(56) References Cited

U.S. PATENT DOCUMENTS

| | | | |
|---|---|---|---|
| 4,553,084 A | 11/1985 | Wrathall | |
| 4,820,968 A * | 4/1989 | Wrathall | 323/316 |
| 4,885,477 A | 12/1989 | Bird et al. | |
| 5,081,379 A | 1/1992 | Korteling | |
| 5,245,523 A * | 9/1993 | Juzswik | 363/56.03 |
| 5,642,034 A * | 6/1997 | Amano | 323/277 |
| 5,867,014 A | 2/1999 | Wrathall et al. | |
| 5,917,312 A * | 6/1999 | Brkovic | 323/282 |
| 5,982,160 A | 11/1999 | Walters et al. | |
| 6,160,388 A | 12/2000 | Skelton et al. | |
| 6,166,528 A | 12/2000 | Rossetti et al. | |
| 6,219,262 B1 | 4/2001 | Burgyan | |
| 6,246,220 B1 | 6/2001 | Isham et al. | |
| 6,377,034 B1 | 4/2002 | Ivanov | |
| 6,441,597 B1 | 8/2002 | Lethellier | |
| 6,479,975 B1 * | 11/2002 | Plankensteiner et al. | 323/316 |
| 6,717,389 B1 | 4/2004 | Johnson | |
| 6,781,354 B2 | 8/2004 | Zhang | |
| 6,812,677 B2 | 11/2004 | Walters et al. | |
| 7,050,914 B2 * | 5/2006 | Tzeng et al. | 702/64 |
| 7,327,129 B2 * | 2/2008 | Chen et al. | 323/285 |
| 7,449,896 B2 * | 11/2008 | Ochi | 324/713 |
| 7,586,367 B2 * | 9/2009 | De Lima Filho | 327/562 |
| 7,633,317 B2 * | 12/2009 | Miranda et al. | 327/51 |
| 7,683,593 B2 * | 3/2010 | Tao | 323/277 |

OTHER PUBLICATIONS

Mammano, B.; "Current Sensing Solutions for Power Supply Designers"; Unitrode Seminar Notes SEM1200; 1999.
Yang, J. and Hua, L.; "Analysis and Design Consideration of Using Current Sensing Transformer in Forward Converter with Synchronous Rectification"; Proc. of IEEE APEC; vol. 2; pp. 878-882; 2004.
Liu, Y. and Jain, P.; "A New Current Sensing Scheme for Zero-Voltage Switching Phase-Shifted Bridge Converter"; Proc. of Telecommunications Energy Conference; pp. 567-573; 2000.

(Continued)

*Primary Examiner* — Gary L Laxton

(57) ABSTRACT

A current sensor having a pair of sense transistors is disclosed. The sense transistors sense a current conducted by a power transistor of a voltage regulator. The ratio in size between the power transistor and the sense transistors corresponds to a scaling factor M. Each sense transistor has an associated series connected sense resistor. The two sense resistors are unbalanced and provide a differential voltage based on the sensed current at the sense transistor to a transconductor. The transconductor has heavy emitter degeneration to provide an output current substantially proportional to the current conducted by the primary power transistor, the proportion determined by the scaling factor M and a ratio of the emitter degeneration and sense resistors.

20 Claims, 3 Drawing Sheets

OTHER PUBLICATIONS

Forghani-Zadeh, H.P. and Rincon-Mora, G.A.; "Current-Sensing Techniques for DC-DC Converters"; Proc. of IEEE MWSCAS; pp. 557-580; vol. 2; Aug. 2002.

Chen, J., Lin, Y., Lin, H., Su, J., Chung, W., Hwang, Y., and Tseng, C.; "On-Chip Current Sensing Technique for Hysteresis Current Controlled DC-DC Converter"; Elec. Letters; vol. 41; No. 2; 2005.

Yuvarajan, S. and Wang, L.; "Performance Analysis and Signal Processing in a Current Sensing Power" MOSFET (SENSEFET); Proc. of IEEE Industry Applications Society Annual Meeting; vol. 2; pp. 1445-1450; 1991.

Grant, D.A. and Williams, R.; "Current Sensing MOSFETs for Protection and Control"; Proc. of the IEEE Colloquium on Measurement Techniques for Power Electronics; pp. 8/1-8/5; 1992.

Koduh, M., Hoshi, Y., Momota, S., Fujihira, T. and Sakurai, K.; "Current Sensing IGBT for Future Intelligent Power Module"; Proc. of Power Semiconductor Devices and ICs; pp. 303-306; 1996.

Ohme, B. and Larson, M.; "Control Circuit Design for High Temperature Linear Regulators"; Proc. of High Temperature Electronics Conference; pp. 45-50; 1998.

Xiao, Y., Cao, J. and Spring, K.; "Current Sensing Trench Power MOSFET for Automotive Applications"; IEEE Proc. of APEC; vol. 2; pp. 766-770; 2005.

Leung, C., Mok, P. and Leung, K.; "A 1.2-V Buck Converter with a Novel On-Chip Low-Voltage Current-Sensing Scheme"; Proc. of IEEE ISCAS; vol. 5; pp. 824-827; 2004.

Zhang, Y., Zane, R., Prodic, A., Erickson, R. and Maksimovic, D.; "Online Calibration of MOSFET On-State Resistance for Precise Current Sensing"; IEEE Trans. Power Electronics Letters; vol. 2; pp. 100-103; Sep. 2004.

Sun, J., Zhou, J., Xu, M. and Lee, F.; "A Novel Input-Side Current Sensing Method to Achieve AVP for Future VRs"; Proc. of IEEE APEC; vol. 1; pp. 287-293; 2005.

Tokura, N., Yamamoto, T. and Hara, K.; "On-Chip New Current Sensing Technology with High Accuracy Using Field Effect Resistance for Intelligent Power MOSFETs"; Proc. Int. Symp. on Power Semic. Devices and Ics; pp. 160-161; 1992.

Chen, J., Su, J., Lin, H., Chang, C., Lee, Y., Chen, T., Wang, H., Chang, K., and Lin, P.; "Integrated Current Sensing Circuits Suitable for Step-Down DC-DC Converters"; Elec. Letters; vol. 40; No. 3; 2004.

Dallago, E., Passoni, M., and Sassone, G.; "Lossless Current Sensing in Low-Voltage High-Current DC/DC Modular Supplies"; IEEE Trans. on Industrial Electronics; vol. 47; pp. 1249-1252; Dec. 2000.

Zhou, X., Xu, P. and Lee, F.; "A Novel Current-Sharing Control Technique for Low-Voltage High-Current Voltage Regulator Module Applications"; IEEE Trans. Power Electron; vol. 15; pp. 1153-1162.

Chang, C.; "Combined Lossless Current Sensing for Current Mode Control"; Proc. of IEEE APCE; vol. 1; pp. 404-410; 2004.

Lee, C. and Mok, P.; "On-Chip Current Sensing Technique for CMOS Monolithic Swith-Mode Power Converters"; IEEE Proc. of ISCAS; pp. 265-268; May 2002.

Su, W.J., Lidgey, F.J., Porta, S. and Zhu, Q.S.; "Analysis of IC Op-Amp Power-Supply Current Sensing"; Proc. of IEEE ISCAS; pp. 541-544; vol. 5; 1994.

Nordholt, E.H.; "Extending Opamp Capabilities by Using Power-Supply"; IEEE Trans. Circuits and Systems; vol. 29; pp. 411-414; Jun. 1982.

Givelin, P., Bafleur, M., Tounier, E., Laopoulos, T. and Siskos, S.; "Application of a CMOS Current Mode Approach to On-Chip Current Sensing in Smart Power Circuits"; IEEE Proc. Circuits Devices Syst.; vol. 142; pp. 357-363; Dec. 1995.

* cited by examiner

DIFFERENTIAL CURRENT SENSOR DEVICE AND METHOD

FIELD OF THE DISCLOSURE

The present disclosure relates generally to electronic devices and more specifically to electronic devices having signal sensing devices.

BACKGROUND

Power supplies designed for providing an operating voltage to an electronic device typically utilize a voltage regulator to provide a substantially constant voltage to a load device despite variations in the current dissipated by the load. Voltage regulators can include a current sensor to sense the current provided to the load. The sensed current can be used by a feedback portion of the voltage regulator to protect the load device and the power supply from an over-current situation resulting from a short circuit fault or other failure. The sensed current can also be used by a feedback system whereby the voltage provided to the device is controlled, independent of the current provided to the device.

A typical current sensing technique includes monitoring a voltage drop across a sense resistor which is inserted in series with an output terminal of the voltage regulator, and thus is in the current path of the load device receiving power from the regulator. However, this current sensing technique can be undesirable due to the power consumption caused by the sense resistor.

DETAILED DESCRIPTION

A current sensor having a pair of sense transistors is disclosed. The sense transistors sense a current conducted by a power transistor of a voltage regulator. The ratio in size between the power transistor and the sense transistors corresponds to a scaling factor M. Each sense transistor has an associated series connected sense resistor. The two sense resistors are unbalanced and provide a differential voltage based on the sensed current at the sense transistor to a transconductor. The transconductor is configured with transistors with emitters connected to resistor, so that the transistors will have heavy emitter degeneration. Accordingly, the transconductor provides an output current substantially proportional to the current conducted by the primary power transistor, the proportion determined by the scaling factor M and a ratio of the emitter degeneration resistor and sense resistors. By fabricating the primary power transistor and current sensor as a monolithic device, the transistors and resistors can be matched to reduce errors in the sensed current due to process and temperature variations. Further, the sense resistors and emitter degeneration resistors are relatively small resistors to reduce power consumption of the current sensor.

Figure 1:
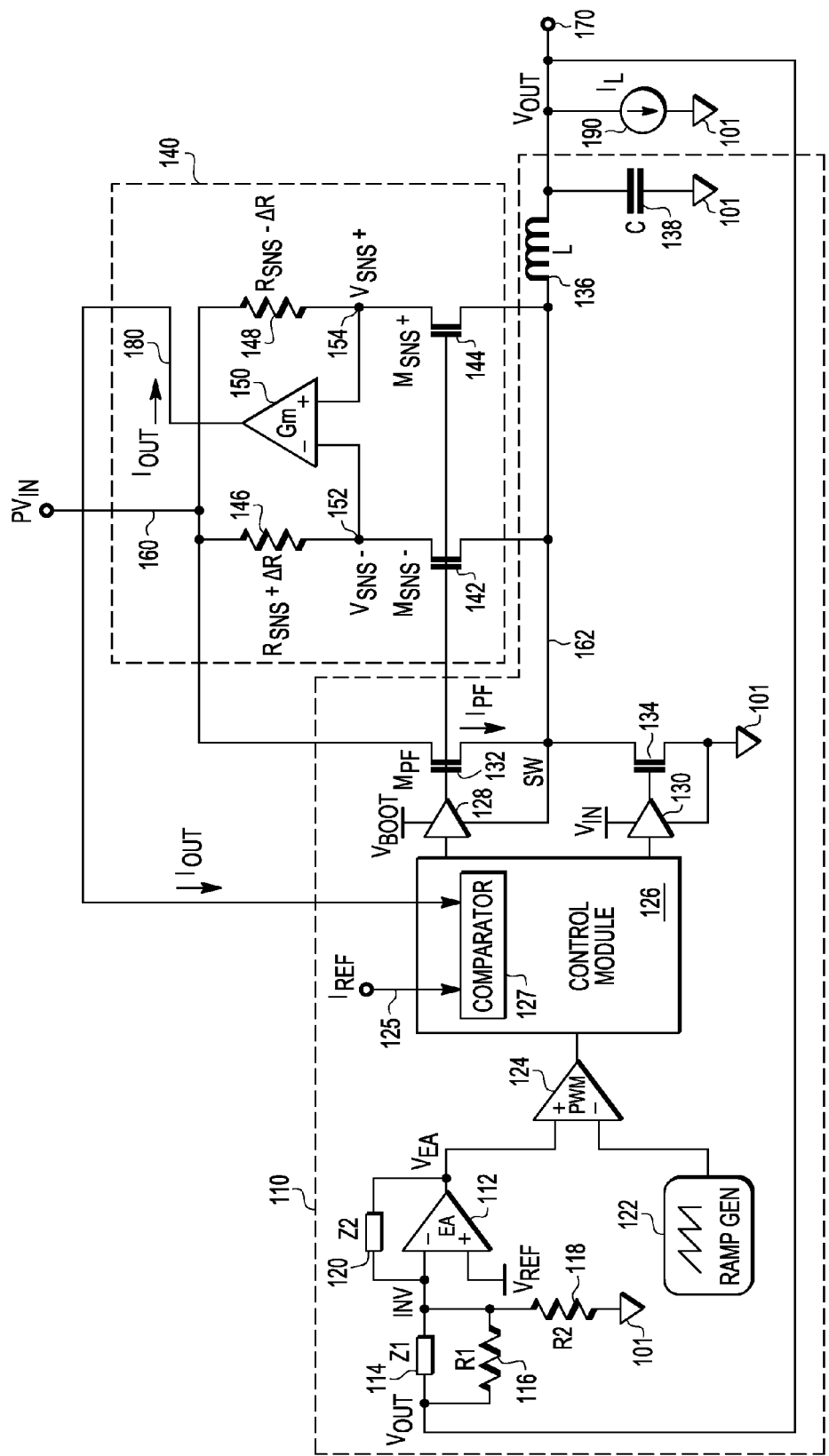
FIG. 1 illustrates a combined circuit and block diagram of a voltage regulator with an associated current sensor in accordance with at least one embodiment of the present disclosure.

FIG. 1 illustrates in partial schematic and partial block diagram form, a DC-DC voltage converter 100 in accordance with at least one embodiment of the present disclosure. DC-DC converter 100 includes a voltage regulator 110 and a current sensor 140.

Voltage regulator 110 includes an operational amplifier 112, resistors 116 and 118, reactive components 114 and 120, a ramp generator 122, an operational amplifier 124, control module 126, drivers 128 and 130, field effect power transistor 132, pull-down power transistor 134, an output inductor 136, and an output capacitor 138. Operational amplifier 112 has a non-inverting input to receive a voltage labeled "$V_{REF}$", an inverting input to receive a signal labeled "INV", and an output for providing a signal labeled "$V_{EA}$". Reactive component 120, labeled "Z2", has a first electrode connected to the inverting input of operational amplifier 112 and a second electrode connected to the output of operational amplifier 112. Reactive component 114, labeled "Z1", has a first electrode for receiving a signal $V_{OUT}$ from output terminal 170, and a second electrode connected to the inverting input of operational amplifier 112. Resistor 116, labeled "R1", is connected in parallel with reactive component 114. Resistor 118, labeled "R2", has a first electrode connected to the inverting input of operational amplifier 112 and a second electrode connected to a ground voltage reference 101. Operational amplifier 124 is configured as a pulse width modulator and has a non-inverting input for receiving the output of operational amplifier 112, an inverting input for receiving the output of ramp generator 122, and an output.

Control module 126 has a first input for receiving the output of pulse width modulator 124, a second input connected to node 180, a third input connected to node 125, a first output and a second output. A current comparator 127 is a subcomponent of control module 126 and has a first input for receiving a signal labeled "$I_{REF}$", a second input for receiving a feedback signal labeled "$I_{OUT}$", and an output. Driver 128 has a first input connected to the first output of control module 126, a second input for receiving a voltage reference labeled "$V_{BOOT}$", a third input for receiving a voltage labeled "SW" from node 162, and an output. Driver 130 has a first input connected to the second output of control module 126, a second input for receiving a voltage reference labeled "$V_{IN}$", a third input connected the ground voltage reference 101, and an output. Power transistor 132, labeled "$M_{PF}$", has a control (gate) electrode connected to the output of driver 128, a first current electrode connected to node 160 for receiving voltage reference $PV_{IN}$, and a second current electrode connected to node 162. Pull-down power transistor 134 has a gate electrode connected to the output of driver 130, a first current electrode connected to node 162, and a second current electrode connected to the ground voltage reference 101. Inductor 136, labeled "L", has a first electrode connected to node 162, and a second electrode connected to output terminal 170. Capacitor 138, labeled "C", has a first electrode connected to output terminal 170 and a second electrode connected to the ground voltage reference 101. Load device 190, labeled "$I_L$" has a first terminal connected to output terminal 170 and a second terminal connected to the ground voltage reference 101.

Current sensor 140 includes two sense transistors 142 and 144, sense resistor 146 and sense resistor 148, and a transconductor 150. Sense transistor 142, labeled "$M_{SNS}$-", has a gate electrode connected to the output of driver 128, a first current electrode connected to node 152, and a second current electrode connected to node 162. Sense transistor 144 labeled "$M_{SNS}{}^+$" has a gate electrode connected to the output of driver 128, a first current electrode connected to node 154 and a second current electrode connected to node 162. Sense resistor 146 has a first electrode connected to terminal 160 and a second electrode connected to node 152. Sense resistor 148 has a first electrode connected to terminal 160 and a second electrode connected to node 154. Transconductor 150 has an inverting input connected node 152, a non-inverting input connected to node 154, and an output connected to node 180 ($I_{OUT}$) for providing a current feedback signal to the second input of control module 126.

During operation, DC-DC converter 100 receives an unregulated voltage reference from input terminal 160, labeled "$PV_{IN}$", and supplies a regulated voltage to load device 190, which is connected to an output terminal 170, labeled "$V_{OUT}$". Power transistor 132, serving as a power switch, conducts current from input terminal 160 to node 162 in response to a control signal provided by driver 128. The control signal is itself controlled in response to an output signal from control module 126. An output filter comprised of inductor 136 and capacitor 138 reduces ripple present on node 162 and provides regulated voltage $V_{OUT}$ to output terminal 170 and load device 190.

Voltage regulator 110 is a feedback system wherein the voltage at the output terminal 170 is monitored and fluctuations in the output voltage due to changing load current demand are reduced. The regulated voltage at output terminal 170 is fed back to the amplifier/filter circuit comprising operational amplifier 112 and associated resistors and reactive components. The non-inverting input of operational amplifier 112 receives signal "$V_{REF}$" which is used to determine a relative voltage potential at output terminal 170. Operational amplifier 124 receives a signal from the output of operational amplifier 112 and a saw-tooth waveform from ramp generator 122, and provides pulses of variable duty cycle to control module 126. Control module 126, in combination with drivers 128 and 130, controls the current conducted by power transistors 132 and 134 and controls the level of the voltage $V_{OUT}$. It will be appreciated that the configuration of the voltage regulator 110 is one example of a voltage regulator, and that the current sensor 140 can be used in conjunction with other voltage regulator configurations, including boost configurations, buck configurations, and any combination thereof. For example, in one configuration, the power transistor 134 can be replaced by a diode.

Current sensor 140 monitors the current supplied to the load device. Control module 126 receives the current feedback signal $I_{OUT}$ from current sensor 140 as well as a threshold current signal $I_{REF}$. Comparator 127 compares currents $I_{OUT}$ with $I_{REF}$ and provides an output signal indicating the difference between the currents. Based on the output signal of the comparator, control module 126 can regulate the voltage and/or current provided at output terminal 170 by controlling the conductivity of power transistor 132. In addition, if the output of comparator 127 indicates a short-circuit or other over load situation at load 190, control module 126 can respond by turning off power transistor 132 ($M_{PF}$) and turning on the pull-down power transistor 134, thereby setting signal SW, and subsequently signal $V_{OUT}$, to a potential of substantially zero volts and reducing the current provided to load 190.

Figure 2:
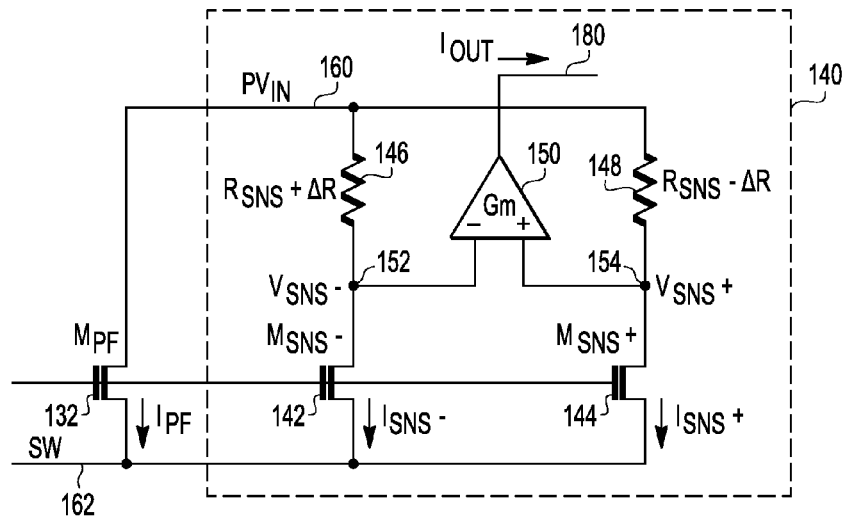
FIG. 2 illustrates an enlarged view of the voltage regulator illustrated at FIG. 1 in order to highlight specific signals of the regulator more clearly.

Referring to FIG. 2, a portion 200 of DC-DC converter 100 is illustrated, including power transistor 132 and current sensor 140. Current sensor 140 includes sense transistors 142 and 144, sense resistors 146 and 148, and transconductor 150.

Power transistor 132 ($M_{PF}$) has a gate electrode connected to the output of driver 128 at FIG. 1, a first current electrode connected to node 160 for receiving voltage reference $PV_{IN}$, and a second current electrode connected to node 162. Sense transistor 142 ($M_{SNS}{}^-$) has a control (gate) electrode connected to the output of driver 128 at FIG. 1, a first current electrode connected to node 152 ($V_{SNS}{}^-$) and a second current electrode connected to node 162. Sense transistor 144 ($M_{SNS}{}^+$) has a control (gate) electrode connected to the output of driver 128 at FIG. 1, a first current electrode connected to node 154 ($V_{SNS}{}^+$) and a second current electrode connected to node 162. Sense resistor 146 has a first electrode connected to terminal 160 and a second electrode connected to node 152. Sense resistor 148 has a first electrode connected to terminal 160 and a second electrode connected to node 154. Transconductor 150 has an inverting input connected to node 152, a non-inverting input connected to node 154, and an output connected to node 180 ($I_{OUT}$).

In the illustrated embodiment, power transistor 132 conducts current from input terminal $PV_{IN}$ to node 162 based upon a control signal at the gate of power transistor 132 that is determined by control module 126 at FIG. 1. Resistor 146 is in series with transistor 142, and the series-connected resistor 146 and transistor 142 are connected in parallel with the drain and source terminals of power transistor 132. The resistive value of resistor 146 is $R_{SNS}+\Delta R$. Similarly, resistor 148 is in series with transistor 144, and the series-connected resistor 148 and transistor 144 are connected in parallel with power transistor 132. The resistive value of resistor 148 is $R_{SNS}-\Delta R$. The gate terminals of transistors 142 and 144 are both connected to the gate terminal of power transistor 132. Transconductor 260 receives signals $V_{SNS}{}^-$ and $V_{SNS}{}^+$ on its inverting and non-inverting inputs, respectively, and thus responds to the difference in voltage between nodes 152 and 154.

The channel width and length of transistors 142 and 144 are configured such that the currents, labeled "$I_{SNS}{}^-$" and "$I_{SNS}{}^+$" respectively, will be a fraction, approximately 1/M, of the current conducted by power transistor 132. The transistor scaling factor "M", in one embodiment, is approximately equal to 1000. All devices are assumed to be operating in the linear region.

The voltage across the two inputs of transconductor 150 is:

$$V_{SNS}=V_{SNS}{}^+-V_{SNS}{}^- \quad (1)$$

Accordingly, $V_{SNS}$ can be expressed as:

$$V_{SNS} = I_{PF}R_{DSon}\left[\frac{(R_{SNS}+\Delta R)}{MR_{DSon}+(R_{SNS}+\Delta R)} - \frac{(R_{SNS}-\Delta R)}{MR_{DSon}+(R_{SNS}-\Delta R)}\right] \quad (2)$$

where $RDS_{ON}$ is the channel resistance of power transistor 132, $I_{PF}$ is the current conducted by power transistor 132, and M is the transistor scaling factor. The resistances $RDS_{ON}$, $R_{SNS}-\Delta R$, and $R_{SNS}+\Delta R$ are configured such that:

$$MR_{DSon} >> R_{SNS}+\Delta R \quad (3)$$

In one embodiment, typical values for $RDS_{ON}$ are 0.05 ohms, $R_{SNS}$ is 3.0 ohms, and $\Delta R$ is 2.0 ohms. Accordingly, equation (2) can be reduced to:

$$V_{SNS} \cong I_{PF}\left[\frac{(R_{SNS}+\Delta R)}{M} - \frac{(R_{SNS}-\Delta R)}{M}\right] = 2\frac{I_{PF}}{M}\Delta R \quad (4)$$

$V_{SNS}$ is therefore primarily dependent on $\Delta R$ and the transistor scaling factor M. By fabricating transistors 132, 142, and 144 on the same monolithic integrated circuit, the transistor scaling factor M can be reasonably controlled. Likewise, the resistor values $R_{SNS}-\Delta R$ and $R_{SNS}+\Delta R$ can be similarly controlled.

Figure 3:
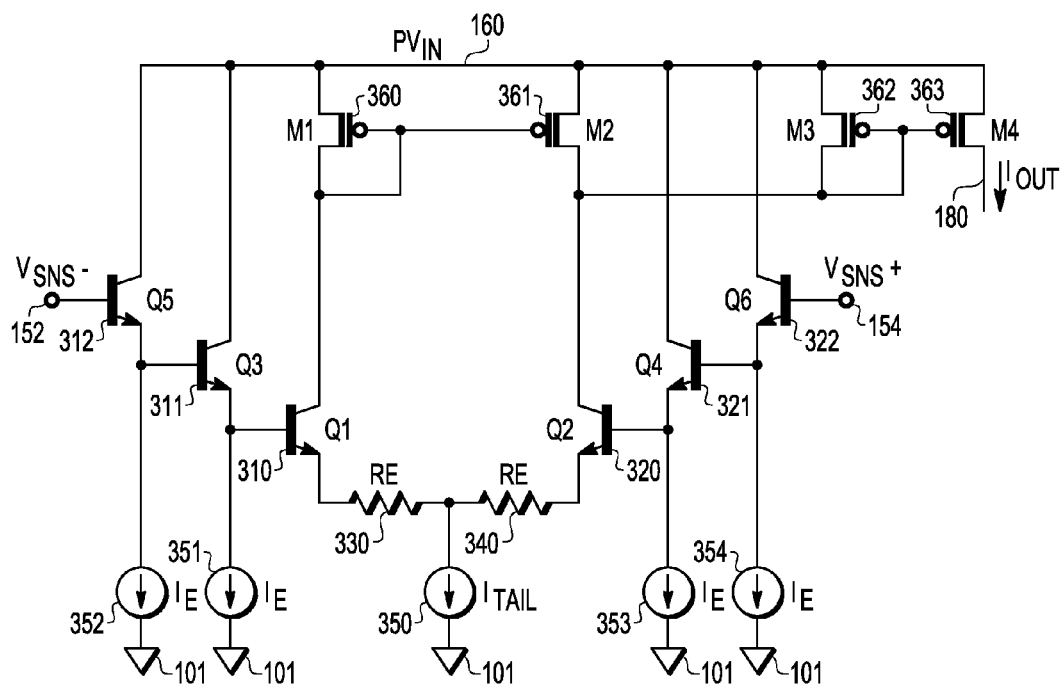
FIG. 3 illustrates a circuit diagram of a transconductor illustrated at FIGS. 1 and 2 in accordance with at least one embodiment of the present disclosure.

Attention is now directed to FIG. 3 wherein a schematic diagram of transconductor 150 is illustrated, in accordance with at least one embodiment of the present disclosure. Transconductor 150 receives differential voltage $V_{SNS}$ and provides current feedback signal $I_{OUT}$ to control module 126 at FIG. 1. Transconductor 150 includes bipolar junction transistors 310, 311, 312, 320, 321, and 322, P-channel field effect transistors 360, 361, 362, and 363, and signal (current) sources 350, 351, 352, 353, and 354.

Transistor 312, labeled "Q5", has a control (base) electrode connected to node 152 for receiving the signal $V_{SNS}^-$, a current (collector) electrode connected to node 160, $PV_{IN}$, and a current (emitter) electrode. Current source 352 has a first terminal connected to the emitter electrode of transistor 312 and a second terminal connected to the ground voltage reference 101. Transistor 311, labeled "Q3", has a base electrode connected to the emitter electrode of transistor 312, a collector electrode connected to node 160, and an emitter electrode. Current source 351 has a first terminal connected to the emitter electrode of transistor 311 and a second terminal connected to the ground voltage reference 101. Transistor 360, labeled "M1", has a control (gate) electrode, a first current electrode connected to node 160, and a second current electrode connected to its gate electrode. Transistor 310, labeled "Q1", has a base electrode connected to the emitter electrode of transistor 311, a collector electrode connected to the second current electrode of transistor 360, and an emitter electrode. Resistor 330 has a first electrode connected to the emitter electrode of transistor 310 and a second electrode. Transistor 361, labeled "M2", has a gate electrode connected to the gate electrode of transistor 360, a first current electrode connected to node 160, and a second current electrode. Transistor 320, labeled "Q2", has a base electrode, a collector electrode connected to the second current electrode of transistor 361, and an emitter electrode. Resistor 340 has a first electrode connected to the emitter electrode of transistor 320 and a second electrode connected to the second electrode of resistor 330. Current source 350, labeled "$I_{TAIL}$", has a first terminal connected to the second terminals of resistors 330 and 340, and a second terminal connected to the ground voltage reference 101. Transistor 321, labeled "Q4" has a base electrode, a collector electrode connected to node 160, and an emitter electrode connected to the base electrode of transistor 320. Current source 353 has a first terminal connected to the emitter electrode of transistor 321. Transistor 322 has a base electrode connected to node 154 for receiving the signal $V_{SNS}^+$, a collector electrode connected to node 160, and an emitter electrode connected to the base electrode of transistor 321. Current source 354 has a first terminal connected to the emitter electrode of transistor 322, and a second terminal connected to the ground reference voltage 101. Transistor 362 has a gate electrode, a first current electrode connected to node 160, and a second current electrode connected to its gate electrode and to the second current electrode of transistor 361. Transistor 363 has a gate electrode connected to the gate electrode of transistor 362, a first current electrode connected to node 160, and a second current electrode connected to node 180 for providing feedback current signal $I_{OUT}$ at node 180.

Transconductor 150 includes a differential pair of bipolar transistor 310 (Q1) and 320 (Q2), each with a corresponding emitter degeneration resistor 330 and 340, respectively. Tail current ($I_{TAIL}$) is provided by current source 350. Transistors 360 and 361 are active loads, and transistors 362 and 363 comprise a current mirror. Transistors 311, 312, 321, and 322 are configured as level shifters to ensure proper biasing of the diode-connected transistors 360 and 362 because of the high common-mode voltage of $V_{SNS}^-$ and $V_{SNS}^+$ relative to supply voltage reference $PV_{IN}$. Resistors 330 and 340 each have resistance values represented by "RE".

Transconductor 150 is configured so that the stage effective transconductance of transconductor 150 can be expressed by the equation:

$$g_{meff} = \frac{g_m}{1 + g_m R_E} \quad (5)$$

where $g_m = I_{TAIL}/2U_T$ and $U_T = kT/q$ is the thermal voltage, where k is the Boltzmann constant, T is the absolute temperature in Kelvin degrees, and q is the electron charge. $U_T$ has a dimension of volts, and is denoted as thermal voltage, as its value depends on temperature. At room temperature, it corresponds approximately to 25 mV.

In the illustrated embodiment, RE is configured so that $g_m R_E \gg 1$. Accordingly, the stage effective transconductance can be expressed as:

$$g_{meff} \cong \frac{1}{R_E} \quad (6)$$

Since $I_{OUT} = g_{meff} V_{SNS}$:

$$\frac{I_{OUT}}{I_{PF}} \cong \frac{2}{M} \frac{\Delta R}{R_E} \quad (7)$$

Thus, the relationship between $I_{PF}$ and $I_{OUT}$ is relatively independent of the absolute values of the resistors of current sensor 140 or upon the transconductance of transconductor 150. Instead, the relationship is substantially determined by the transistor scaling factor M and a ratio of resistors 146, 148, 330, and 340. By fabricating these resistors out of the same material, and as part of the same monolithic integrated circuit, variations in component values due to variations in process and temperature will substantially track, improving accuracy of the current sensor.

Figure 4:
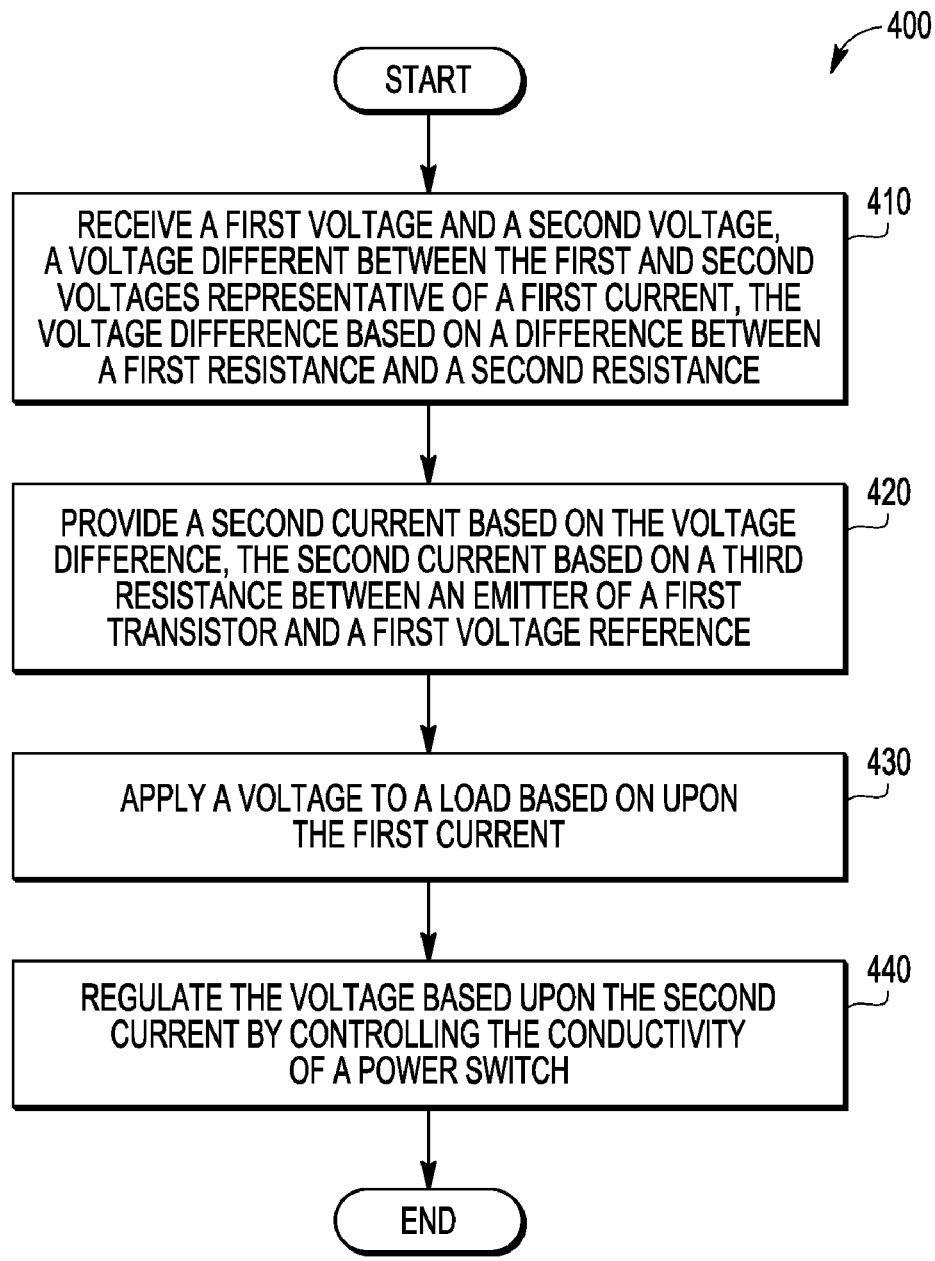
FIG. 4 illustrates a flow diagram of a method for providing a current sensor applicable for regulating a voltage in accordance with at least one embodiment of the present disclosure.

FIG. 4 illustrates a flow diagram of a method 400 for providing a current sensor applicable for regulating a voltage, in accordance with at least one embodiment of the present disclosure. Method 400 starts at block 410 wherein a first voltage and a second voltage are received at a current sensor such as current sensor 140 of FIG. 1. In particular, the first voltage and second voltage are received at the inputs of the transconductor 150. A voltage difference between the first and second voltages is representative of a first current ($I_{PF}$), and the voltage difference is based on a difference between the resistor 146 and the resistor 148. The flow proceeds to block 420 wherein the transconductor 150 provides a second current ($I_{OUT}$) based on the voltage difference. The second current is based on the resistor 330 (FIG. 3), between the emitter of transistor 310 and a ground reference. The flow proceeds to block 430 where the voltage $V_{OUT}$ is applied to the 190 load based upon the current $I_{OUT}$. The flow moves to block 440 where the voltage $V_{OUT}$ is regulated based upon the current $I_{OUT}$ by controlling the conductivity of the power switch formed by transistor 140.

Other embodiments, uses, and advantages of the disclosure will be apparent to those skilled in the art from consideration of the specification and practice of the disclosure disclosed herein. For example, although the device described herein has been illustrated as employing transistors of a particular polarity type, it will be appreciated that transistors of other polarity types can be used. The specification and drawings should be considered exemplary only, and the scope of the disclosure is accordingly intended to be limited only by the following claims and equivalents thereof.

What is claimed is:

1. A voltage converter device, comprising:
   a power switch;
   a control module comprising an output to provide a control signal to control the conductivity of the power switch; and
   a current sensor having an input configured to receive the control signal and an output configured to provide a feedback signal to the control module, the current sensor comprising:
      a first resistor comprising a first terminal and a second terminal;
      a first transistor comprising a first current electrode coupled to the second terminal of the first resistor, a second current electrode, and a control electrode configured to receive the control signal;
      a second resistor comprising a first terminal coupled to the first terminal of the first resistor and a second terminal;
      a second transistor comprising a first current electrode coupled to the second terminal of the second resistor, a second current electrode, and a control electrode configured to receive the control signal; and
      a transconductor comprising a first input coupled to the second terminal of the first resistor, a second input coupled to the second terminal of the second resistor, and an output configured to provide the feedback signal.

2. The voltage converter device of claim 1, wherein the feedback signal comprises a first current substantially proportional to a second current through the power switch.

3. The voltage converter of claim 2, wherein a relationship between the first current and the second current is based on a scaling factor, the scaling factor based on a ratio between a size of the first transistor and a size of the power switch.

4. The voltage converter of claim 1, wherein the first resistor has a first resistive value different than a second resistive value of the second resistor.

5. The voltage converter of claim 1, wherein the transconductor comprises:
   a third transistor comprising a first current electrode coupled to the first terminal of the first resistor, a second current electrode, and a control electrode coupled to the second terminal of the first resistor;
   a third resistor comprising a first terminal coupled to the second current electrode of the third transistor;
   a fourth transistor comprising a first current electrode coupled to the first voltage reference, a second current electrode, and a control electrode coupled to the second terminal of the second resistor; and
   a fourth resistor comprising a first terminal coupled to the second current electrode of the fourth transistor and a second terminal coupled to the second terminal of the third resistor.

6. The voltage converter of claim 5, wherein:
   the feedback signal comprises a first current substantially proportional to a second current through the power switch;
   a resistive value of the first resistor differs from a resistive value of the second value by a resistive difference; and
   a relationship between the first current and the second current is based on a ratio between the resistive difference and a resistive value of the third resistor.

7. The voltage converter device of claim 1, wherein the control module comprises a current comparator, the current comparator comprising a first input to receive the feedback signal, a second input to receive a threshold signal, and an output configured to provide an output signal, the output signal based on a comparison of the feedback signal and the threshold signal.

8. The voltage converter device of claim 7, wherein the control signal is configured to control the conductivity of the power switch based on the output signal of the current comparator.

9. The voltage converter device of claim 7, wherein the threshold signal comprises a current reference signal.

10. A current sensor device comprising:
    a first transistor comprising a first current electrode, and a control electrode configured to receive a control signal, the first transistor configured to draw a first current proportional to a sensed current;
    a first resistor comprising a first terminal and a second terminal coupled to the first current electrode of the first transistor, the second terminal configured to apply a first voltage based on the first current;
    a second transistor comprising a first current electrode, and a control electrode configured to receive a control signal, the second transistor configured to draw a second current proportional to a sensed current;
    a second resistor comprising a first terminal and a second terminal coupled to the first current electrode of the first transistor, the second terminal configured to apply a second voltage based on the first current; and
    a transconductor comprising a first input coupled to the second terminal of the first resistor, a second input coupled to the second terminal of the second resistor, and an output configured to provide an output current, the output current substantially proportional to the sensed current.

11. The current sensor device of claim 10 wherein the first resistor has a first resistive value different from a resistive value of the second resistor.

12. The current sensor device of claim 10, further comprising a third transistor comprising a first current electrode coupled to the first terminal of the first resistor, a second current electrode coupled to the second current electrode of the first resistor, and a control electrode configured to receive the control signal, the third transistor configured to draw the sensed current based on the control signal.

13. The current sensor device of claim 12, wherein the third transistor comprises a power switch of a voltage regulator.

14. The current sensor device of claim 12, wherein the third transistor is larger than the first transistor and the second transistor.

15. The current sensor device of claim 10, wherein the transconductor comprises:
    a third transistor comprising a first current electrode coupled to the first terminal of the first resistor, a second current electrode, and a control electrode coupled to the second terminal of the first resistor;

a third resistor comprising a first terminal coupled to the second current electrode of the third transistor;

a fourth transistor comprising a first current electrode coupled to the first terminal of the first resistor, a second current electrode, and a control electrode coupled to the second terminal of the second resistor; and a fourth resistor comprising a first terminal coupled to the second current electrode of the fourth transistor and a second terminal coupled to the second terminal of the third resistor.

16. The current sensor device of claim 15, wherein:

a resistive value of the first resistor differs from a resistive value of the second value by a resistive difference; and a relationship between the first current and the second current is based on a ratio between the resistive difference and a resistive value of the third resistor.

17. A method comprising:

sensing a first current at a power supply, wherein sensing comprises:

receiving a first voltage and a second voltage, the first voltage and second voltage each based on the first current, a voltage difference between the first and second voltages based on a difference between a first resistance and a second resistance, wherein the first voltage corresponds to a voltage at a first current electrode of a first transistor and the second voltage corresponds to a voltage at a first current electrode of a second transistor; and providing a second current based on the voltage difference; and regulating the first current based on the second current.

18. The method of claim 17, further comprising:

regulating a third voltage provided by the power supply based on the second current.

19. The method of claim 18, wherein regulating the third voltage comprises regulating the voltage by controlling the conductivity of a power switch of the power supply.

20. The method of claim 17 wherein:

the first resistance is based on a first resistor having a first terminal and a second terminal;

the first current electrode of the first transistor is coupled to the second terminal of the first resistor, and a control electrode of the first transistor is configured to receive a control signal, the control signal based on the second current;

the second resistance is based on a second resistor having a first terminal coupled to the first terminal of the first resistor and a second terminal;

the first current electrode of the second transistor is coupled to the second terminal of the second resistor, and a control electrode of the second transistor is configured to receive the control signal; and the second current is provided by a transconductor, the transconductor comprising a first input coupled to the second terminal of the first resistor, a second input coupled to the second terminal of the second resistor, and an output configured to provide the second current.

* * * * *